(12) United States Patent
Chen et al.

(10) Patent No.: US 10,304,765 B2
(45) Date of Patent: May 28, 2019

(54) SEMICONDUCTOR DEVICE PACKAGE

(71) Applicant: Advanced Semiconductor Engineering, Inc., Kaohsiung (TW)

(72) Inventors: Chien-Hua Chen, Kaohsiung (TW); Ming-Hung Chen, Kaohsiung (TW); Hsu-Chiang Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 2 days.

(21) Appl. No.: 15/618,084

(22) Filed: Jun. 8, 2017

(65) Prior Publication Data
US 2018/0358290 A1 Dec. 13, 2018

(51) Int. Cl.
| | | |
|---|---|---|
| *H01L 23/04* | (2006.01) | |
| *H01L 23/498* | (2006.01) | |
| *H01L 21/48* | (2006.01) | |
| *H05K 1/16* | (2006.01) | |
| *H01L 23/538* | (2006.01) | |

(52) U.S. Cl.
CPC ...... *H01L 23/49827* (2013.01); *H01L 21/486* (2013.01); *H01L 21/4853* (2013.01); *H01L 21/4857* (2013.01); *H01L 23/49816* (2013.01); *H01L 23/49822* (2013.01); *H01L 23/49838* (2013.01); *H01L 23/49894* (2013.01); *H01L 23/5389* (2013.01); *H05K 1/162* (2013.01)

(58) Field of Classification Search
CPC ......... H01L 24/27; H01L 24/29; H01L 24/82; H01L 24/83; H01L 25/0657; H01L 21/4853; H01L 21/486; H01L 23/49816; H01L 23/49827; H01L 23/49838; H01L 23/49894; H01L 23/5389; H01L 24/18
USPC ................................ 257/684, 686, 690, 698
See application file for complete search history.

(56) References Cited

U.S. PATENT DOCUMENTS

| | | | |
|---|---|---|---|
| 6,699,787 B2 * | 3/2004 | Mashino | ............... H01L 23/481 257/E23.011 |
| 9,349,723 B2 | 5/2016 | Lin et al. | |
| 9,449,925 B2 | 9/2016 | Lin et al. | |
| 2001/0010627 A1 * | 8/2001 | Akagawa | ............ H01L 23/3121 361/761 |
| 2002/0019069 A1 * | 2/2002 | Wada | ................ H01L 21/76898 438/69 |

* cited by examiner

*Primary Examiner* — Brook Kebede
(74) *Attorney, Agent, or Firm* — Foley & Lardner LLP; Cliff Z. Liu

(57) ABSTRACT

A semiconductor device package includes a substrate, a first insulation layer, a support film and an interconnection structure. The substrate has a first sidewall, a first surface and a second surface opposite to the first surface. The first insulation layer is on the first surface of the substrate and has a second sidewall. The first insulation layer has a first surface and a second surface adjacent to the substrate and opposite to the first surface of the first insulation layer. The support film is on the second surface of the substrate and has a third sidewall. The support film has a first surface adjacent to the substrate and a second surface opposite to the first surface of the support film. The interconnection structure extends from the first surface of the first insulation layer to the second surface of the support film via the first insulation layer and the support film. The interconnection structure covers the first, second and third sidewalls.

20 Claims, 13 Drawing Sheets

SEMICONDUCTOR DEVICE PACKAGE

BACKGROUND

1. Technical Field

The present disclosure relates to a semiconductor device package and a method of manufacturing the same. In particular, the present disclosure relates to a semiconductor device package including a through glass via (TGV) for electrical interconnection.

2. Description of the Related Art

An integrated passive device (IPD) of a semiconductor device package may include a through glass via (TGV) for electrical interconnection. A drill technique is used to form a TGV in a relatively thick (e.g., greater than about 300 micrometers (μm)) glass substrate. A support/protection film (e.g., Ajinomoto Build-up Film (ABF)) may be used to handle a relatively thin (e.g., less than about 300 μm) glass substrate. In such cases, the ABF film may be applied to both sides of the glass substrate and the drilling operation may be twice performed on the substrate to form the TGV. However, the drilling operation may damage the glass substrate, especially the relatively thin glass substrate. Moreover, planarity of the ABF is not good enough and may adversely affect the subsequent process (e.g., process of forming capacitors).

SUMMARY

In one or more embodiments, a semiconductor device package includes a substrate, a first insulation layer, a support film and an interconnection structure. The substrate has a first sidewall, a first surface and a second surface opposite to the first surface. The first insulation layer is on the first surface of the substrate and has a second sidewall. The first insulation layer has a first surface and a second surface adjacent to the substrate and opposite to the first surface of the first insulation layer. The support film is on the second surface of the substrate and has a third sidewall. The support film has a first surface adjacent to the substrate and a second surface opposite to the first surface of the support film. The interconnection structure extends from the first surface of the first insulation layer to the second surface of the support film via the first insulation layer and the support film. The interconnection structure covers the first, second and third sidewalls.

In one or more embodiments, a semiconductor device package includes a substrate, a first support film, a second support film and an interconnection structure. The substrate has a first sidewall, a first surface and a second surface opposite to the first surface. The first support film is on the second surface of the substrate and has a bottom surface and a second sidewall. The second support film is on the first surface of the substrate and has a top surface and a third sidewall. The interconnection structure extends from the top surface of the second support film to the bottom surface of the first support film via the first support film and the second support film. The interconnection structure covers the first, second and third sidewalls.

In one or more embodiments, a method for manufacturing a semiconductor device package includes providing a substrate having a sidewall, a first surface and a second surface opposite to the first surface; disposing a support film on the second surface of the substrate; disposing a first insulation layer on the first surface of the substrate; (d) forming a through hole penetrating the substrate, the first insulation layer and the support film, wherein the through hole is defined by or is bounded by the sidewall of the substrate, a sidewall of the first insulation layer and a sidewall of the support film; and disposing an interconnection structure covering the sidewalls of the substrate, the first insulation layer and the support film.

In one or more embodiments, a method for manufacturing a semiconductor device package includes providing a substrate having a sidewall, a first surface and a second surface opposite to the first surface; disposing a first support film on the second surface of the substrate; disposing a second support film on the first surface of the substrate; forming a through hole penetrating the substrate, the first support film and the second support film, wherein the through hole is defined by or is bounded by the sidewall of the substrate, a sidewall of the first support film and a sidewall of the second support film; and disposing an interconnection structure covering the sidewalls of the substrate, the first support film and the second support film.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. In particular, the present disclosure relates to a semiconductor device package structure including an improved through glass via (TGV) structure for electrical interconnection.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
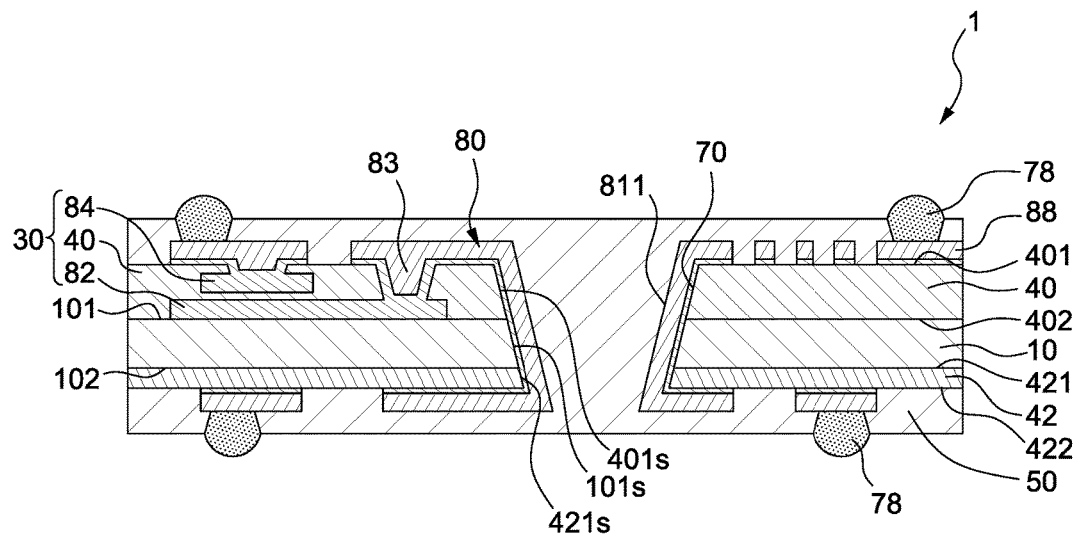
FIG. 1 is a cross-sectional view of a semiconductor device package in accordance with some embodiments of the present disclosure.

FIG. 1 is a cross-sectional view of a semiconductor device package 1 in accordance with some embodiments of the present disclosure. The semiconductor device package 1 includes a substrate 10, a passive component layer 30, insulation layers 40 and 50, a support film 42, interconnection structure 80 and 83, conductive connects 78, and patterned conductive layers 82, 84 and 88. The insulation layer 40 may include a passivation layer 40 that is also additionally a support layer.

In one or more embodiments, the substrate 10 includes glass, silicon, silicon dioxide ($SiO_2$), or a combination thereof. In one or more embodiments, a thickness of the substrate 10 is in a range of about 100 micrometers (μm) to about 200 μm. In one or more embodiments, a thickness of the substrate 10 is less than about 300 μm. In some embodiments, the substrate 10 is a glass substrate and a surface roughness of the glass substrate is less than about 1 μm, such as about 900 nanometers (nm) or less or about 800 nm or less in terms of root-mean-square surface roughness, due to a manufacturing process in accordance with some embodiments of the present disclosure. The substrate 10 has a sidewall 101s. The substrate 10 has a top surface 101 and a surface 102 opposite to the surface 101.

In one or more embodiments, the substrate 10 may include one or more active components (e.g., integrated circuits (ICs)) embedded in the substrate 10, and/or one or more active components disposed on the substrate 10. In one or more embodiments, the substrate 10 may include one or more passive components (e.g., the passive component layer 30 as shown in FIG. 1) disposed on the substrate 10. The patterned conductive layers 82 and 84, together with the insulation layer 40, form the passive component layer 30. The passive component layer 30 may include a capacitor 30. The passive component layer 30 is connected to the interconnection structure 80 through the interconnection structure 83. The patterned conductive layers 82, 84 and 88 may include, for example, copper (Cu), or other metal, or a metal alloy, or other conductive material. The patterned conductive layers 82, 84 and 88 may include a seed layer to allow plating during the formation of the patterned conductive layers 82, 84 and 88, or the patterned conductive layers 82 and 84 are a structure for metal-insulator-metal (MIM). The patterned conductive layers 82 and 84 may be processed or disposed by a sputter process.

The insulation layer 40 is disposed on the surface 101 of the substrate 10. The insulation layer 40 has a top surface 401 and a surface 402 adjacent to the substrate 10 and opposite to the top surface 401. The insulation layer 40 has a sidewall 401s. In some embodiments, the insulation layer 40 includes a suitable insulating material. For example, the insulation layer 40 may include a silicon nitride ($SiN_x$) film; however, other suitable materials may be additionally or alternatively used. In one or more embodiments, a thickness of the insulation layer 40 is in a range of about 8 μm to about 10 μm. The support film 42 is disposed on the surface 102 of the substrate 10. The support film 42 has a sidewall 421s. The support film 42 has a surface 421 adjacent to the substrate 10 and a surface 422 opposite to the surface 421 of the support film 42. The support film 42 may include a polymer material; however, other suitable materials may be additionally or alternatively used. The insulation layer 40 has a top surface 401 and the interconnection structure 80 covers the top surface 401 of the insulation layer 40. The support film 42 has a bottom surface 422 and the interconnection structure 80 covers the bottom surface 422 of the support film 42. The interconnection structure 80 is extended from the surface 401 of the insulation layer 40 to the surface 422 of the support film 42 via the insulation layer 40 and the support film 42. The interconnection structure 80 covers the sidewalls 101s, 401s, and 421s. The interconnection structure 80 on both sides of the substrate 10 can be formed or disposed by one-time plating, and the process can be simplified.

The interconnection structure 80 is extended from the surface 101 of the substrate 10 to the surface 102 of the substrate 10 via the insulation layer 40 and the support film 42. The interconnection structure 80 covers the sidewalls 101s, 401s, and 421s. The interconnection structure 80 is connected to the patterned conductive layers 82 through the interconnection structure 83. The interconnection structures 80 and 83 may include, for example, Cu, or other metal, or a metal alloy, or other conductive material. The interconnection structures 80 and 83 may include a seed layer to allow for plating during the formation of the interconnection structures 80 and 83.

The insulation layer 50 penetrates the substrate 10, the insulation layer 40 and the support film 42. The insulation layer 50 covers the interconnection structure 80, a portion of the top surface 401 of the insulation layer 40 and a portion of the bottom surface 422 of the support film 42. In some embodiments, the material of the insulation layer 50 may be different from the material of the insulation layer 40. The insulation layer 50 may include Ajinomoto Build-up Film (ABF); however, other suitable materials may be additionally or alternatively used. In some embodiments, the ABF on the top surface 101 of the substrate 10 may be eliminated to facilitate the formation of the integrated passive device IPD (e.g., for better planarity).

The conductive connects 78 are connected to the patterned conductive layers 88. The conductive connects 78 may include solder balls. In some embodiments, the insulation material of the insulation layer 40 may be different from the insulation material of the support film 42. The insulation layer 50 is filled into a through hole 811. The insulation layer 50 is surrounded by the interconnection structure 80. A through hole 70 penetrates the substrate 10, the insulation layer 40 and the support film 42. In some embodiments, the through hole 70 is formed by a sand-blasting technique, rather than a drilling technique. Damage of the relatively thin (e.g., glass) substrate 10 can be avoided during the manufacturing process by replacing the drilling technique with the sand-blasting technique.

Figure 2A:
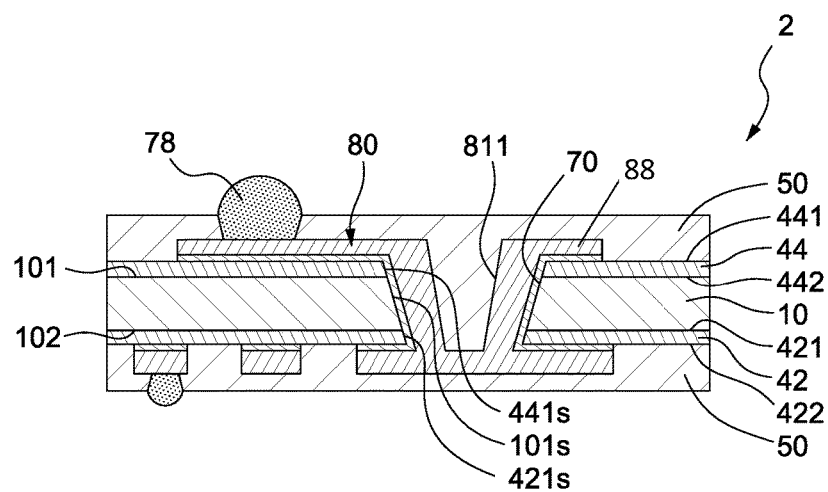
FIG. 2A is a cross-sectional view of a semiconductor device package in accordance with some embodiments of the present disclosure.

FIG. 2A is a cross-sectional view of a semiconductor device package 2 in accordance with some embodiments of the present disclosure. The semiconductor device package 2 is similar to the semiconductor device package 1 of FIG. 1, and same-numbered components are not described again with respect to FIG. 2A. The semiconductor device package 2 includes a substrate 10, a passive component layer 30 (not shown), an insulation layer 50, support films 42 and 44, interconnection structure 80, conductive connects 78, and patterned conductive layers 88.

In one or more embodiments, the substrate 10 includes glass, silicon, silicon dioxide ($SiO_2$), or a combination thereof. In one or more embodiments, a thickness of the substrate 10 is in a range of about 100 μm to about 200 μm. In one or more embodiments, a thickness of the substrate 10 is less than about 300 μm. In some embodiments, the substrate 10 is a glass substrate and a surface roughness of the glass substrate is less than about 1 such as about 900 nm or less or about 800 nm or less in terms of root-mean-square surface roughness, due to a manufacturing process in accordance with some embodiments of the present disclosure. The substrate 10 has a sidewall 101s. The substrate 10 has a top surface 101 and a surface 102 opposite to the surface 101.

In one or more embodiments, the substrate 10 may include one or more active components (e.g., ICs) embedded in the substrate 10, and/or one or more active components disposed on the substrate 10. In one or more embodiments, the substrate 10 may include a passive component layer 30 disposed on the substrate 10. The patterned conductive layers 88 may include, for example, Cu, or other metal, or a metal alloy, or other conductive material. The patterned conductive layers 88 may include a seed layer to allow for plating during the formation of the patterned conductive layers 88. The passive component layer 30 is connected to the interconnection structure 80.

The support film 42 is disposed on the surface 102 of the substrate 10. The support film 42 has a sidewall 421s. The support film 42 has a surface 421 adjacent to the substrate 10 and a surface 422 opposite to the surface 421 of the support film 42. The support film 42 may include a polymer material; however, other suitable materials may be additionally or alternatively used. The support film 44 is disposed on the surface 101 of the substrate 10. The support film 44 has a sidewall 441s. The support film 44 has a surface 441 and a surface 442 adjacent to the substrate 10 and opposite to the surface 441 of the support film 44. The support film 44 may include a polymer material; however, other suitable materials may be additionally or alternatively used. In some embodiments, the insulation materials of the support film 42 and the support film 44 are the same.

The interconnection structure 80 is extended from the top surface 441 of the support film 44 to the bottom surface 422 of the support film 42 via the support film 42 and the support film 44. The interconnection structure 80 covers the sidewalls 101s, 421s, and 441s. The interconnection structure 80 covers the top surface 441 of the support film 44 and the bottom surface 422 of the support film 42.

A portion of the insulation layer 50 penetrates the substrate 10, the support film 42 and the support film 44. The insulation layer 50 covers the interconnection structure 80, a portion of the top surface 441 of the support film 44 and a portion of the bottom surface 422 of the support film 42. In some embodiments, the material of the insulation layer 50 may be different from the material of the insulation layer 40. The insulation layer 50 may include ABF; however, other suitable materials may be additionally or alternatively used. The interconnection structure 80 includes or defines a through hole 811. The insulation layer 50 is filled into the through hole 811. A portion of the insulation layer 50 is thus surrounded by the interconnection structure 80. A through hole 70 penetrates the substrate 10 and support films 42 and 44. In some embodiments, the through hole 70 is formed by a sand-blasting technique, rather than a drilling technique.

Figure 2B:
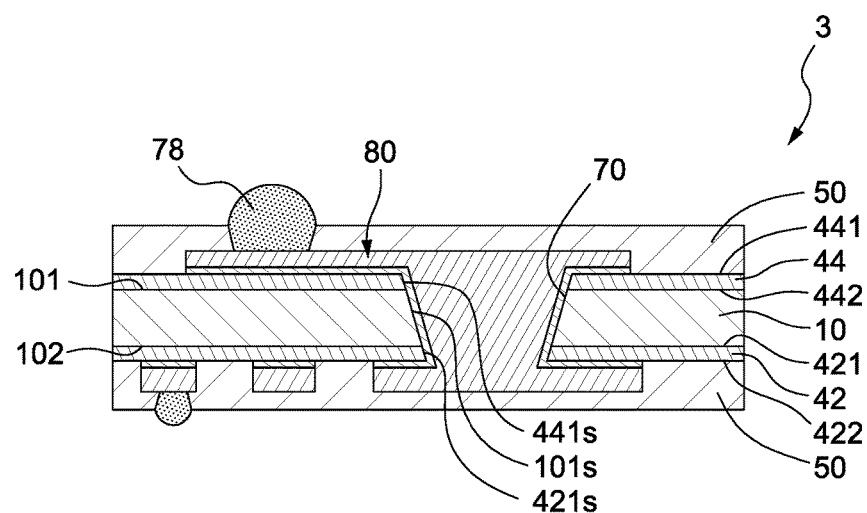
FIG. 2B is a cross-sectional view of a semiconductor device package in accordance with some embodiments of the present disclosure.

FIG. 2B is a cross-sectional view of a semiconductor device package 3 in accordance with some embodiments of the present disclosure. The semiconductor device package 3 is similar to the semiconductor device package 2 of FIG. 2A, and same-numbered components are not described again with respect to FIG. 2B. In FIG. 2B, the interconnection structure 80 does not include the through hole 811. The insulation layer 50 covers the surface of the interconnection structure 80 and is not surrounded by the interconnection structure 80.

Figure 3A:
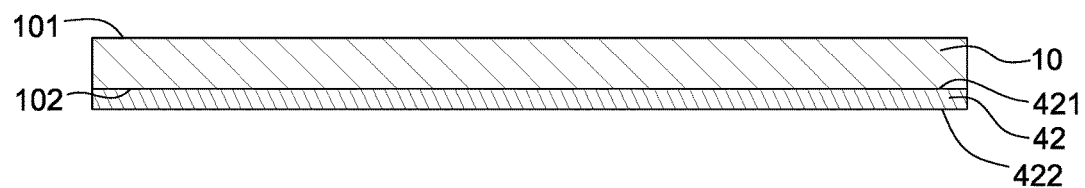
FIG. 3A, FIG. 3B, FIG. 3C, FIG. 3D, FIG. 3E, FIG. 3F, and FIG. 3G illustrate a method of manufacturing the semiconductor device package of FIG. 1 in accordance with some embodiments of the present disclosure.

FIGS. 3A-3G illustrate a method of manufacturing the semiconductor device package 1 of FIG. 1 in accordance with some embodiments. Referring to FIG. 3A, a substrate 10 is provided. The substrate 10 has a top surface 101 and a surface 102 opposite to the surface 101. The substrate 10 includes glass, silicon, $SiO_2$, or a combination thereof. In some embodiments, the substrate 10 is formed of a glass material and a thickness of the substrate 10 is less than about 300 μm. A support film 42 is disposed on the surface 102 of the substrate 10. The support film 42 may include a polymer material; however, other suitable materials may be additionally or alternatively used.

Figure 3B:
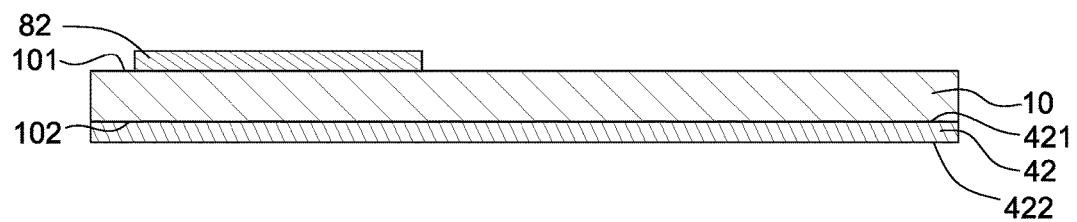
Figure 3C:
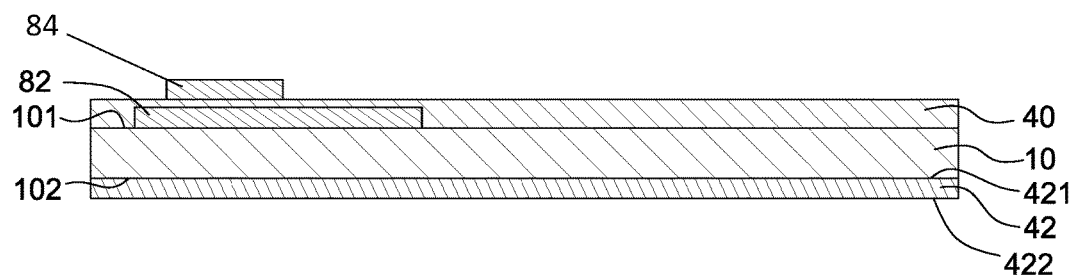

Referring to FIG. 3B, a patterned conductive layer 82 is disposed on the top surface 101 of the substrate 10. Referring to FIG. 3C, a first layer of an insulation layer 40 is disposed on the surface 101 of the substrate 10. For example, the material of the insulation layer 40 may include a $SiN_x$ film; however, other suitable materials may be additionally or alternatively used. A patterned conductive layer 84 is disposed on the first layer of the insulation layer 40. The patterned conductive layers 82 and 84, together with the insulation layer 40, form a passive component layer 30. The passive component layer 30 may include a capacitor 30. The patterned conductive layers 82 and 84 may include, for example, Cu, or other metal, or a metal alloy, or other conductive material. The patterned conductive layers 82 and 84 may include a seed layer to allow for plating during the formation of the patterned conductive layers 82 and 84; or the patterned conductive layers 82 and 84 are a structure for MIM. The patterned conductive layers 82 and 84 may be processed by a sputter process.

Figure 3D:
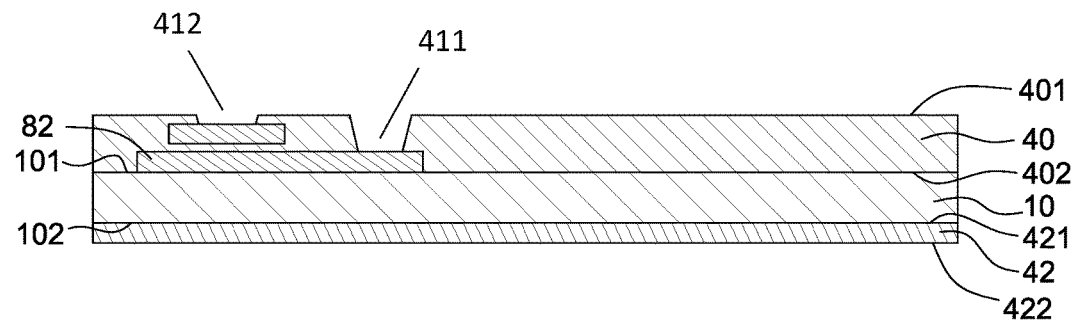
Figure 3E:
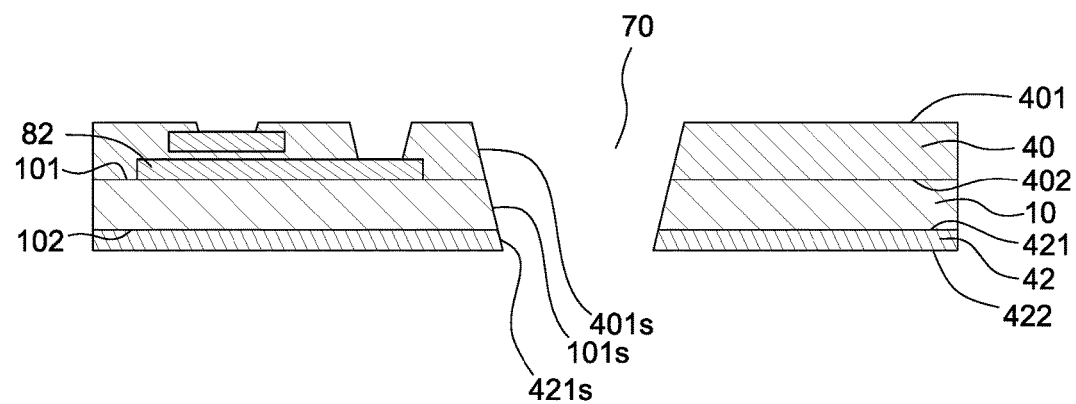

Referring to FIG. 3D, a second layer of the insulation layer 40 is disposed on the first layer of the insulation layer 40. Vias 411 and 412 are formed within the insulation layer 40. Referring to FIG. 3E, in some embodiments, a portion of the substrate 10, the insulation layer 40 and the support film 42 are removed by a sand-blasting technique to form the through hole 70. The through hole 70 penetrates the substrate 10, the insulation layer 40 and the support film 42. In some embodiments, the through hole 70 is formed by a sand-blasting technique, rather than a drilling technique. Damage of the relatively thin (e.g., glass) substrate 10 can be avoided during the manufacturing process by replacing the drilling technique with the sand-blasting technique. The through hole 70 includes the sidewall 101s of the substrate 10, sidewall 401s of the insulation layer 40, and sidewall 421s of the support film 42. The through hole (e.g., TGV) 70 is formed subsequent to the formation of the IPD (such as the passive component layer 30) to improve the process, since one-time drilling or sand-blasting is used.

Figure 3F:
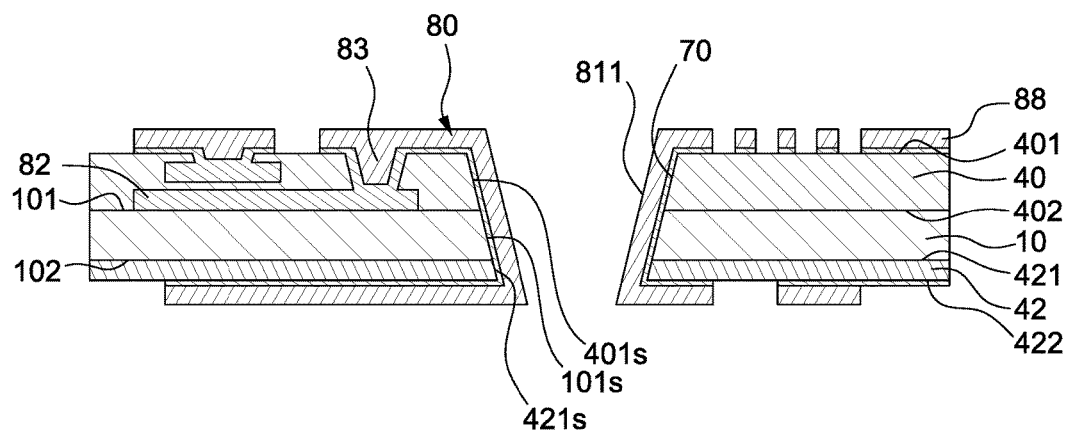

Referring to FIG. 3F, an interconnection structure 83 is disposed to cover the exposed patterned conductive layers 82. An interconnection structure 80 is disposed to cover the sidewall 101s of the substrate 10, sidewall 401s of the insulation layer 40, and sidewall 421s of the support film 42. The interconnection structure 80 also covers a portion of the surface 401 of the insulation layer 40 and the bottom surface 422 of the support film 42. The conductive structure (such as interconnection structure 80) on both sides of the substrate 10 can be formed or disposed by one-time plating, and the process can be simplified. A patterned conductive layer 88 is disposed on the surface 401 of the insulation layer 40. The patterned conductive layer 88 and interconnection structure 83 may include, for example, Cu, or other metal, or a metal alloy, or other conductive material. The patterned conductive layer 88 and interconnection structure 83 may include a seed layer to allow for plating during the formation of the patterned conductive layer 88 and the interconnection structure 83.

Figure 3G:
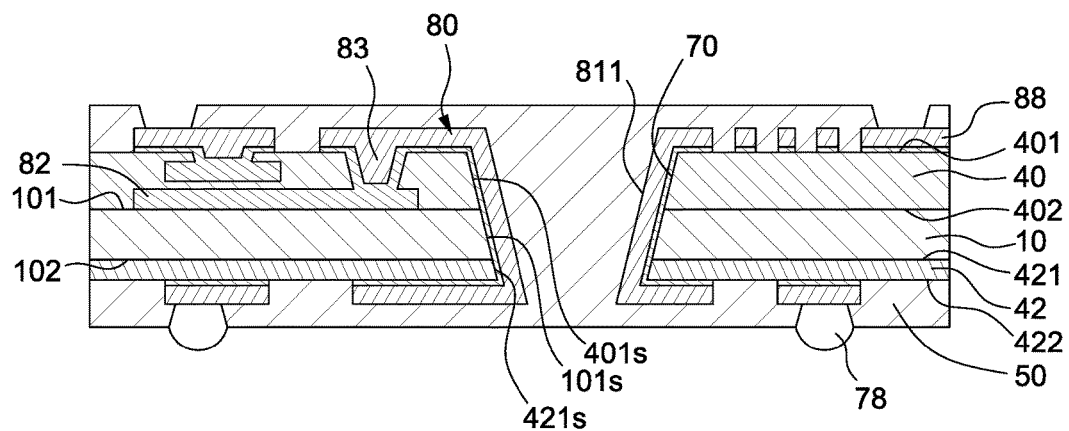

Referring to FIG. 3G, an insulation layer 50 is disposed to cover the interconnection structure 80, a portion of the top surface 401 of the insulation layer 40 and a portion of the bottom surface 422 of the support film 42. The insulation layer 50 is filled within the through hole 811. The insulation layer 50 may include ABF; however, other suitable materials may be additionally or alternatively used. Conductive connects 78 are disposed to be connected to the patterned conductive layers 88. The conductive connects 78 may include solder balls. Next, the semiconductor device package 1 of FIG. 1 is obtained.

Figure 4A:
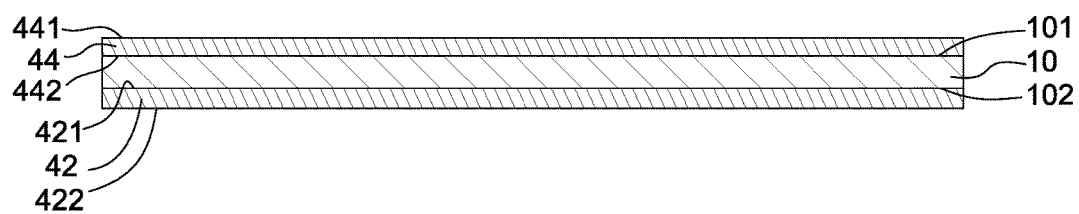
FIG. 4A, FIG. 4B, FIG. 4C, FIG. 4D, FIG. 4E, FIG. 4F, and FIG. 4G illustrate a method of manufacturing another semiconductor device package in accordance with some embodiments of the present disclosure.

FIGS. 4A-4G illustrate a method of manufacturing another semiconductor device package 4 in accordance with some embodiments of the present disclosure. Referring to FIG. 4A, a substrate 10 is provided. The substrate 10 has a top surface 101 and a surface 102 opposite to the surface 101. The substrate 10 includes glass, silicon, $SiO_2$, or a combination thereof. In some embodiments, the substrate 10 is formed of a glass material and a thickness of the substrate 10 is less than about 300 μm. A support film 42 is disposed on the surface 102 of the substrate 10. A support film 44 is disposed on the surface 101 of the substrate 10. The support films 42 and 44 may include a polymer material; however, other suitable materials may be additionally or alternatively used.

Figure 4B:
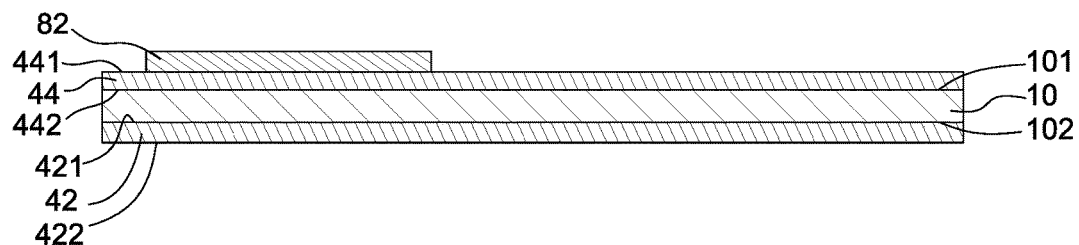
Figure 4C:
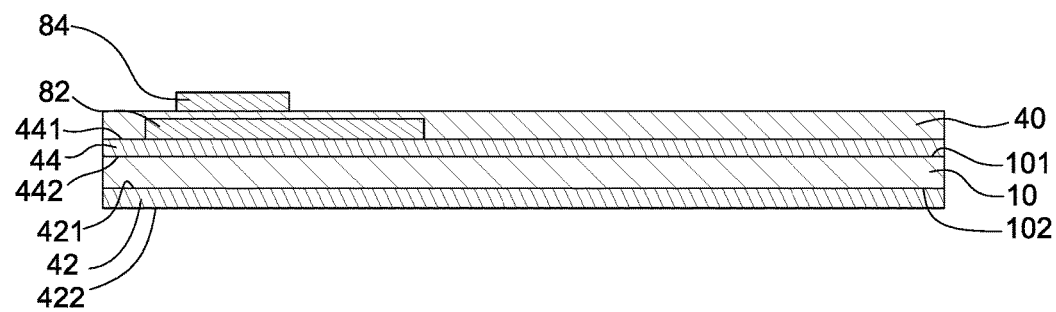

Referring to FIG. 4B, a patterned conductive layer 82 is disposed on the surface 441 of the support film 44. Referring to FIG. 4C, a first layer of an insulation layer 40 is disposed on the surface 441 of the support film 44. For example, the material of the insulation layer 40 may include a $SiN_x$ film; however, other suitable materials may be additionally or alternatively used. A patterned conductive layer 84 is disposed on the first layer of the insulation layer 40. The patterned conductive layers 82 and 84, together with the insulation layer 40, form a passive component layer 30. The passive component layer 30 may include a capacitor 30. The patterned conductive layers 82 and 84 may include, for example, Cu, or other metal, or a metal alloy, or other conductive material. The patterned conductive layers 82 and 84 may include a seed layer to allow for plating during the formation of the patterned conductive layers 82 and 84; or the patterned conductive layers 82 and 84 are a structure for MIM. The patterned conductive layers 82 and 84 may be processed by a sputter process.

Figure 4D:
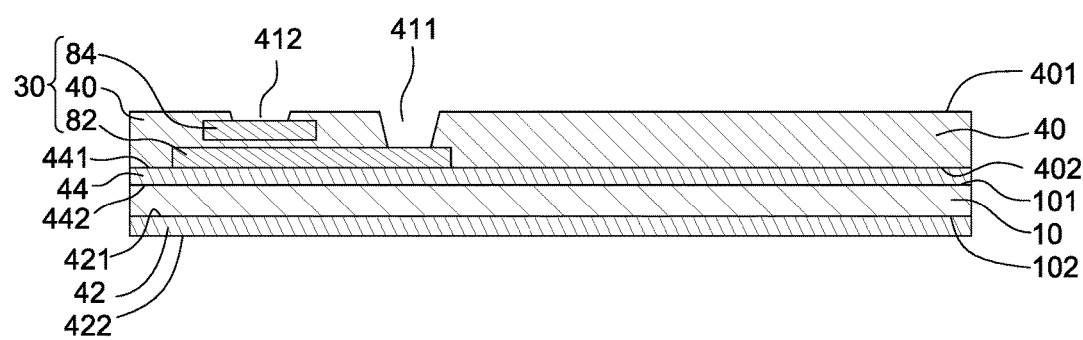
Figure 4E:
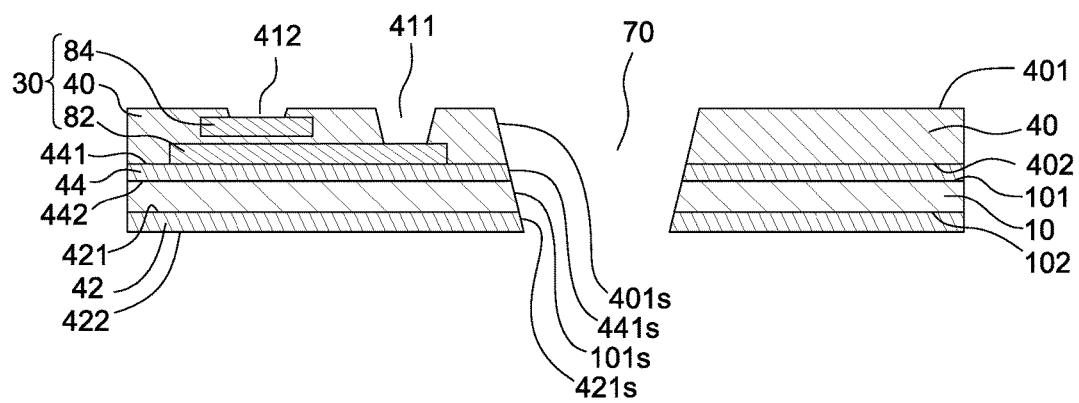

Referring to FIG. 4D, a second layer of the insulation layer 40 is disposed on the first layer of the insulation layer 40. Vias 411 and 412 are formed within the insulation layer 40. Referring to FIG. 4E, in some embodiments, a portion of the substrate 10 and the support films 42 and 44 are removed by a sand-blasting technique to form the through hole 70. In some embodiments, the through hole 70 penetrates the substrate 10 and the support films 42 and 44. In some embodiments, the through hole 70 is formed by a sandblasting technique, rather than a drilling technique. Damage of the relatively thin (e.g., glass) substrate 10 can be avoided during the manufacturing process by replacing the drilling technique with a sand-blasting technique. The through hole 70 includes the sidewall 101s of the substrate 10, the sidewall 401s of the insulation layer 40, sidewall 441s of the support film 44, and sidewall 421s of the support film 42.

Figure 4F:
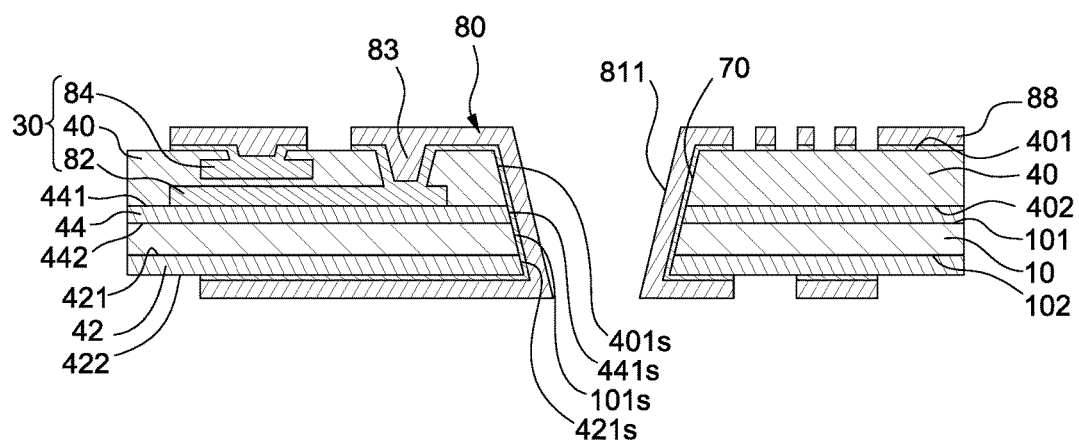

Referring to FIG. 4F, an interconnection structure 83 is disposed to cover the exposed patterned conductive layers 82. An interconnection structure 80 is disposed to cover the sidewall 101s of the substrate 10, sidewall 401s of the insulation layer 40, sidewall 441s of the support film 44, and sidewall 421s of the support film 42. The interconnection structure 80 also covers a portion of the surface 401 of the insulation layer 40 and the bottom surface 422 of the support film 42. A patterned conductive layer 88 is disposed on the surface 401 of the insulation layer 40. The patterned conductive layer 88 and interconnection structure 83 may include, for example, Cu, or other metal, or a metal alloy, or other conductive material. The patterned conductive layer 88 and interconnection structure 83 may include a seed layer to allow for plating during the formation of the patterned conductive layer 88 and interconnection structure 83.

Figure 4G:
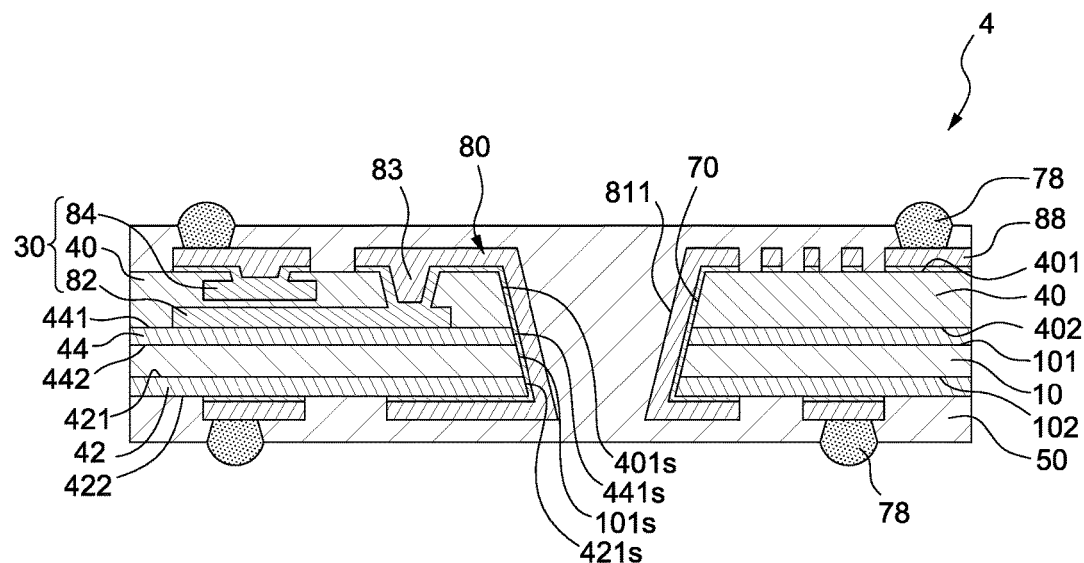

Referring to FIG. 4G, an insulation layer 50 is disposed to cover the interconnection structure 80, a portion of the top surface 401 of the insulation layer 40 and a portion of the bottom surface 422 of the support film 42. The insulation layer 50 is filled within the through hole 811. The insulation layer 50 may include ABF; however, other suitable materials may be additionally or alternatively used. Conductive connects 78 are disposed to be connected to the patterned conductive layers 88. The conductive connects 78 may include solder balls. Next, the semiconductor device package 4 of FIG. 4G is obtained.

Figure 5A:
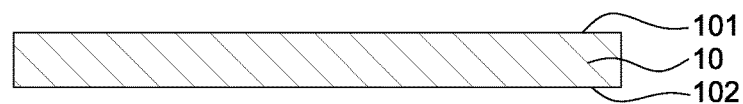
FIG. 5A, FIG. 5B, FIG. 5C, FIG. 5D, FIG. 5E, FIG. 5F, FIG. 5G and FIG. 5H illustrate a method of manufacturing the semiconductor device package of FIG. 2A and FIG. 2B in accordance with some embodiments of the present disclosure.

FIG. 5A, FIG. 5B, FIG. 5C, FIG. 5D, FIG. 5E, FIG. 5F, FIG. 5G and FIG. 5H illustrate a method of manufacturing the semiconductor device package 2 of FIG. 2A and the semiconductor device package 3 of FIG. 2B in accordance with some embodiments of the present disclosure. Referring to FIG. 5A, a substrate 10 is provided. The substrate 10 has a top surface 101 and a surface 102 opposite to the surface 101. The substrate 10 includes glass, silicon, $SiO_2$, or a combination thereof. In some embodiments, the substrate 10 is formed of a glass material and a thickness of the substrate 10 is less than about 300 μm.

Figure 5B:
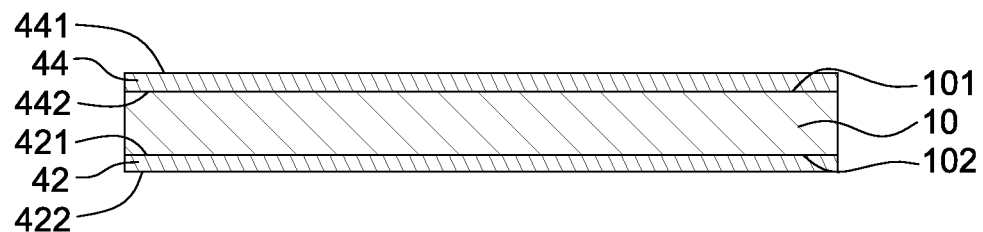

Referring to FIG. 5B, a support film 42 is disposed on the surface 102 of the substrate 10 and a support film 44 is disposed on the surface 101 of the substrate 10. The support films 42 and 44 may include a polymer material; however, other suitable materials may be additionally or alternatively used. The support film 42 has a surface 421 and a surface 422 opposite to the surface 421. The support film 44 has a surface 441 and a surface 442 opposite to the surface 441.

Figure 5C:
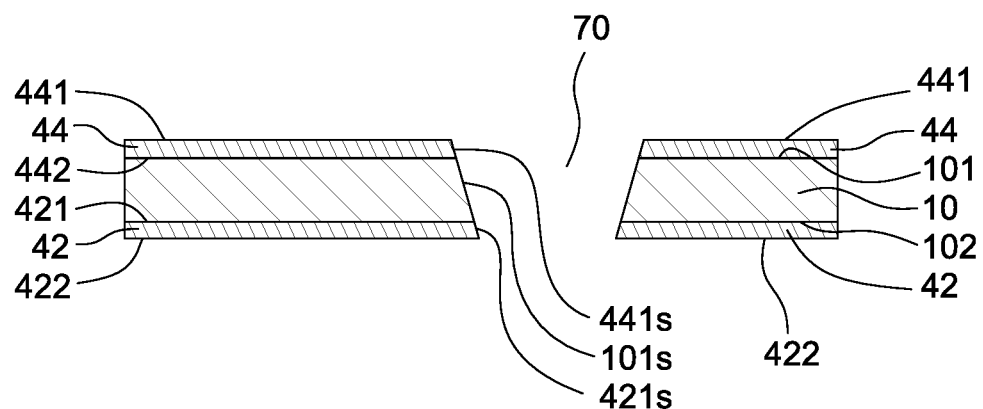

Referring to FIG. 5C, in some embodiments, a portion of the substrate 10 and the support films 42 and 44 are removed by a sand-blasting technique to form the through hole 70. The through hole 70 penetrates the substrate 10 and the support films 42 and 44. In some embodiments, the through hole 70 is formed by a sand-blasting technique, rather than a drilling technique. The through hole 70 includes the sidewall 101s of the substrate 10, sidewall 441s of the support film 44, and sidewall 421s of the support film 42.

Figure 5D:
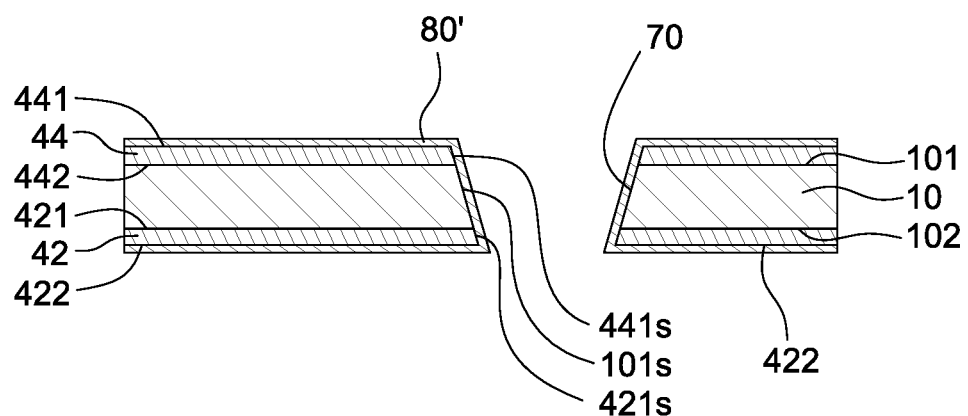

Referring to FIG. 5D, an interconnection structure 80' is disposed on the surface 441 of the support film 44 and the surface 422 of the support film 42. The interconnection structure 80' also covers the sidewall 101s of the substrate 10, sidewall 441s of the support film 44, and sidewall 421s of the support film 42. The interconnection structure 80' may include a seed layer. In some embodiments, the interconnection structure 80' may include, for example, a titanium-copper (Ti—Cu) alloy or another suitable metal or metal alloy, or a combination thereof.

Figure 5E:
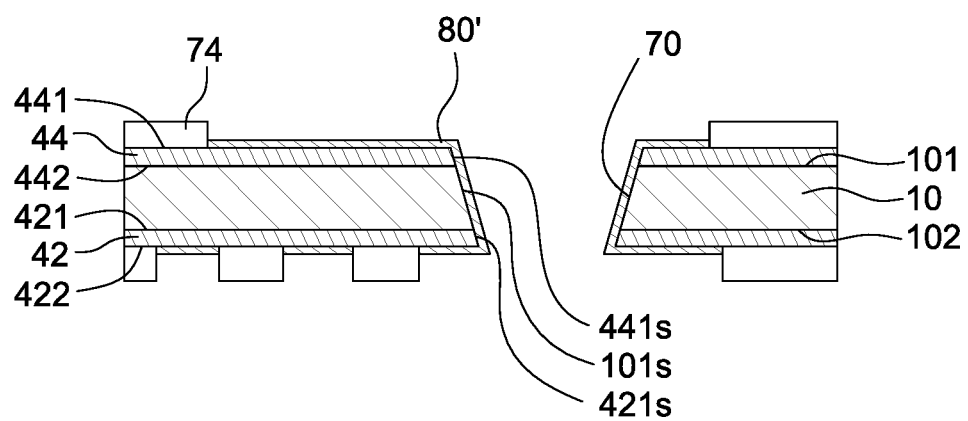

Referring to FIG. 5E, a portion of the interconnection structure 80' is removed. A patterned photoresist layer 74 is disposed on a portion of the surface 441 of the support film 44 and a portion of the surface 422 of the support film 42. In some embodiments, the patterned photoresist layer 74 may include, or may be formed from, a positive photoresist.

Figure 5F:
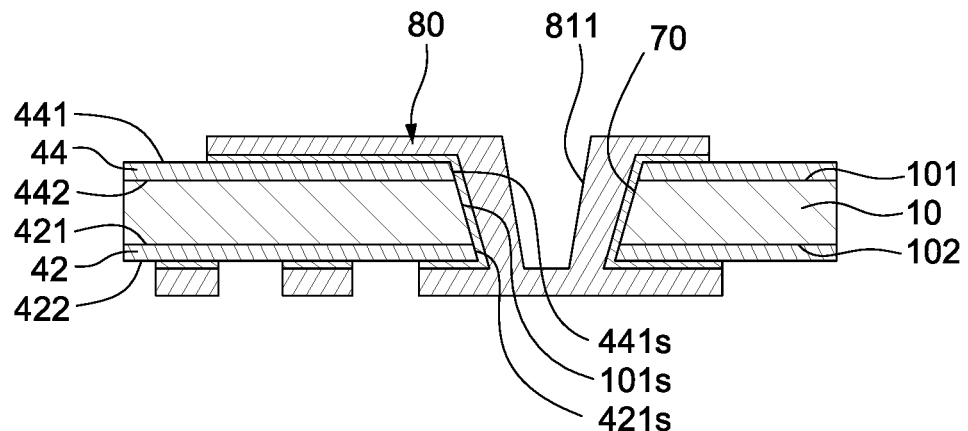

Referring to FIG. 5F, the thickness of the interconnection structure 80' is increased by plating. After plating, the interconnection structure 80 is obtained. The interconnection structure 80 includes or defines a via 811. The interconnection structure 80 may include, for example, Cu, or other metal, or a metal alloy, or other conductive material.

The interconnection structure 80 covers the top surface 441 of the support film 44 and covers the bottom surface 422 of the support film 42.

Figure 5G:
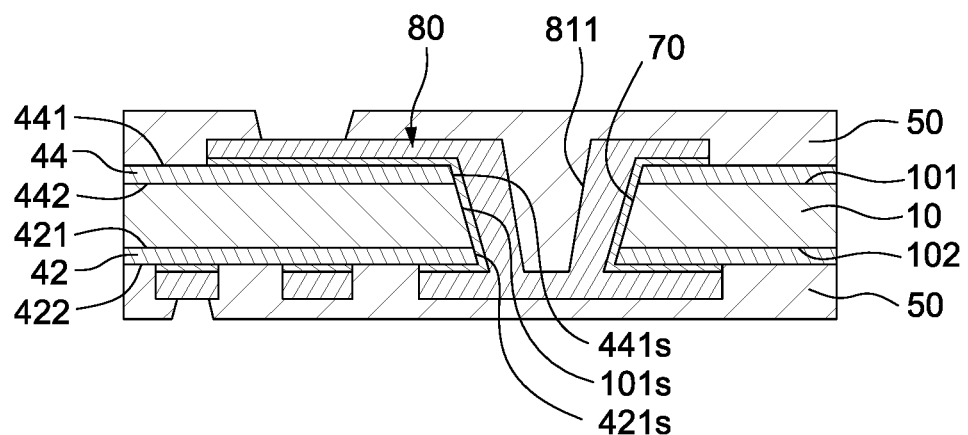

Referring to FIG. 5G, an insulation layer 50 is filled within the via 811 and covers the interconnection structure 80, a portion of the top surface 441 of the support film 44 and a portion of the bottom surface 422 of the support film 42. In some embodiments, the insulation layer 50 may include ABF; however, other suitable materials may be additionally or alternatively used. Next, the conductive connects 78 are disposed on the interconnection structure 80 to obtain the semiconductor device package 2 of FIG. 2A.

Figure 5H:
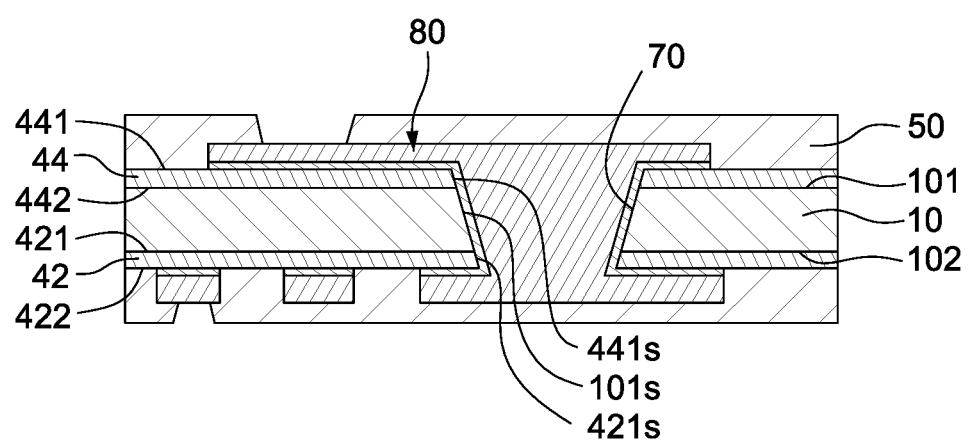

Referring to FIG. 5H following the step in FIG. 5F, if the via 811 in FIG. 5F is completed filled by plating, there is no via in the interconnection structure 80. Next, the conductive connects 78 are disposed on the interconnection structure 80 to obtain the semiconductor device package 3 of FIG. 2B.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
  a substrate having a first sidewall, a first surface and a second surface opposite to the first surface;
  a first insulation layer on the first surface of the substrate and having a second sidewall, wherein the first insulation layer has a first surface and a second surface adjacent to the substrate and opposite to the first surface of the first insulation layer;
  a support film on the second surface of the substrate and having a third sidewall, wherein the support film has a first surface adjacent to the substrate and a second surface opposite to the first surface of the support film; and
  an interconnection structure extending from the first surface of the first insulation layer to the second surface of the support film via the first insulation layer and the support film, the interconnection structure being in direct contact with the first, second and third sidewalls.

2. The semiconductor device package of claim 1, wherein the first surface of the first insulation layer is a top surface and the interconnection structure covers the top surface of the first insulation layer, and the second surface of the support film is a bottom surface and the interconnection structure covers the bottom surface of the support film.

3. The semiconductor device package of claim 2, further comprising a second insulation layer penetrating the substrate, the first insulation layer and the support film, wherein the second insulation layer covers the interconnection structure, a portion of the top surface of the first insulation layer and a portion of the bottom surface of the support film.

4. The semiconductor device package of claim 1, further comprising a passive component layer disposed on the first surface of the substrate and connected to the interconnection structure.

5. The semiconductor device package of claim 1, wherein the substrate comprises a glass material.

6. The semiconductor device package of claim 1, wherein a thickness of the substrate is less than about 300 micrometers (μm).

7. The semiconductor device package of claim 1, wherein the first insulation layer comprises a first insulation material and the support film comprises a second insulation material, and the first insulation material is different from the second insulation material.

8. A semiconductor device package, comprising:
  a substrate having a first sidewall, a first surface and a second surface opposite to the first surface;
  a first support film on the second surface of the substrate and having a bottom surface and a second sidewall;
  a second support film on the first surface of the substrate and having a top surface and a third sidewall; and
  an interconnection structure extending from the top surface of the second support film to the bottom surface of the first support film via the first support film and the second support film, the interconnection structure being in direct contact with the first, second and third sidewalls.

9. The semiconductor device package of claim 8, wherein the interconnection structure covers the top surface of the second support film and the bottom surface of the first support film.

10. The semiconductor device package of claim 9, further comprising a passive component layer disposed on the top surface of the second support film and connected to the interconnection structure.

11. The semiconductor device package of claim 9, further comprising an insulation layer, wherein a portion of the insulation layer penetrates the substrate, the first support film and the second support film, wherein the insulation layer covers the interconnection structure, a portion of the bottom surface of the first support film and a portion of the top surface of the second support film.

12. The semiconductor device package of claim 11, wherein the portion of the insulation layer is surrounded by the interconnection structure.

13. The semiconductor device package of claim 8, wherein the substrate comprises a glass material.

14. The semiconductor device package of claim 8, wherein a thickness of the substrate is less than about 300 µm.

15. The semiconductor device package of claim 8, wherein the first support film and the second support film comprise a same insulation material.

16. A method for manufacturing a semiconductor device package, comprising:

providing a substrate having a sidewall, a first surface and a second surface opposite to the first surface;

disposing a support film on the second surface of the substrate;

disposing a first insulation layer on the first surface of the substrate;

forming a through hole penetrating the substrate, the first insulation layer and the support film, wherein the through hole is defined by the sidewall of the substrate, a sidewall of the first insulation layer and a sidewall of the support film; and disposing an interconnection structure in direct contact with the sidewalls of the substrate, the first insulation layer and the support film, wherein the first insulation layer has a top surface, the support film has a bottom surface, and the interconnection structure extends from the top surface of the first insulation layer to the bottom surface of the support film via the first insulation layer and the support film.

17. The method of claim 16, wherein the interconnection structure covers the top surface of the first insulation layer, and the interconnection structure covers the bottom surface of the support film.

18. The method of claim 16, further comprising disposing a passive component layer on the first surface of the substrate, wherein the passive component layer is connected to the interconnection structure.

19. The method of claim 16, wherein the substrate comprises a glass material.

20. The method of claim 16, wherein a thickness of the substrate is less than about 300 µm.

* * * * *